United States Patent [19]
Ohmi

[11] Patent Number: 5,444,259
[45] Date of Patent: Aug. 22, 1995

[54] PLASMA PROCESSING APPARATUS

[76] Inventor: Tadahiro Ohmi, 1-17-301, Komegabukuro 2-chome, Aoba-ku Sendai-shi, 980 JPX

[21] Appl. No.: 193,083
[22] PCT Filed: Aug. 5, 1992
[86] PCT No.: PCT/JP92/01001
§ 371 Date: Apr. 28, 1994
§ 102(e) Date: Apr. 28, 1994
[87] PCT Pub. No.: WO93/03590
PCT Pub. Date: Feb. 18, 1993

[30] Foreign Application Priority Data
Aug. 5, 1991 [JP] Japan .................. 3-219229

[51] Int. Cl.⁶ ............................ H01J 37/317
[52] U.S. Cl. .............. 250/452.21; 315/111.81; 156/345
[58] Field of Search ............ 250/492.21; 315/111.21, 315/111.81; 156/345

[56] References Cited

U.S. PATENT DOCUMENTS

| | | | |
|---|---|---|---|
| 4,357,195 | 11/1982 | Gorin ............... | 156/345 |
| 4,662,094 | 11/1986 | Otsubo ............. | 156/627 |
| 4,990,859 | 2/1991 | Bouyer et al. ...... | 324/649 |
| 5,064,679 | 11/1991 | Ito et al. .......... | 427/8 |
| 5,167,748 | 12/1992 | Hall ............... | 156/345 |
| 5,170,098 | 12/1992 | Dutton et al. ...... | 315/111.21 |
| 5,173,146 | 12/1992 | Ito et al. .......... | 156/345 |
| 5,273,610 | 12/1993 | Thomas et al. ...... | 156/345 |

FOREIGN PATENT DOCUMENTS
62-85431 4/1987 Japan .
2-26023 1/1990 Japan .
2-166732 5/1992 Japan .

*Primary Examiner*—Bruce C. Anderson
*Attorney, Agent, or Firm*—Baker & Daniels

[57] ABSTRACT

It is an object to provide a plasma processing apparatus which is capable of precisely controlling the energy and density of ions injected into a substrate body, and which is capable of easily conducting the control of process parameters. The present invention is provided with at least: a measurement mechanism for RF power wave forms and RF power; a calculating mechanism for calculating the energy and density of ions injected into a substrate body based on measured values; a memory mechanism for storing process parameters determined in conjunction with the state of the plasma; a display mechanism for displaying memory contents based on output from the memory mechanism; a setting mechanism for setting ion energy and density to predetermined values; an input mechanism for inputting ion energy values and ion density values into the setting mechanism; and a control mechanism for controlling ion energy and density within the apparatus to preset values in accordance with values set in the setting mechanism.

6 Claims, 14 Drawing Sheets

PLASMA PROCESSING APPARATUS

TECHNOLOGICAL FIELD

The present invention relates to a plasma processing apparatus, and in particular relates to a plasma processing apparatus which is capable of the precise control of the energy and the density of ions injected into a substrate body.

BACKGROUND ART

In conventional plasma processing apparatuses, because plasma processing was conducted while controlling externally controllable RF power, RF frequency, gas pressure, gas flow rate, types of gas, and types of added gasses, it was impossible to control the energy and density of the ions which were directly injected into the substrate or the surfaces of the chamber. In order to obtain the optimal conditions for ion energy or density, a number of evaluations were conducted utilizing actual substrates, and based on the results thereof, the optimal conditions were determined empirically, so that this process required an enormous amount of labor. Furthermore, there were problems in that when high energy ions were injected into surface substrates during the plasma processing, damage was caused to the substrates, and when high energy ions were injected into the cheer surfaces, the cheer material was caused to sputter, and the substrate surfaces were contaminated with cheer material. It was essentially impossible to solve these problems while simultaneously determining the etching rate and etching form. For this reason, these problems presented a great obstacle to the realization of deep submicron ULSI having high performance and high reliability. In order to solve these problems, it is essential to precisely control the energy and density of the ions injected into the substrate surfaces, as well as the energy (plasma potential) of the ions injected into the chamber surfaces. Accordingly, there has been urgent demand for a method for measuring the energy and density of ions injected into a substrate during plasma excitation in a plasma processing apparatus, and for measuring the plasma potential, and additionally, for a method of controlling these.

An evaluation method employing a probe has been in common use as an accurate evaluation method for the energy and density of the ions in a plasma, and for the plasma potential; however, as a result of the sputtering of the probe material, there is a great possibility of the contamination of the substrate surfaces. Furthermore, an analysis method employing light absorption or light emission or lasers has been used as a method for the identification of the type of excitation in a plasma; however, as optical energy enters from the exterior, the plasma itself becomes disturbed. Furthermore, measurement of the energy or density distribution of the ions by means of mass spectrometry involves an electrode construction which is complicated, and some time is required for the analysis, so that such a method is unsuitable for real-time monitoring.

Furthermore, in previous apparatuses, only the externally controllable RF power, RF frequency, gas pressure, gas flow rate, type of gas, and type of added gas were controlled, so that it was essentially impossible to precisely control the energy or density of the ions or the plasma potential.

The present applicant has provided, in Japanese Patent Application No. Hei 2-252847, a technology capable of controlling the energy and density of the ions injected into a substrate body by means of the detection of the energy and density of ions injected into the substrate body. However, this technology centers only on the energy and density of the ions, and is not concerned with the control of other process parameters at desired values. That is to say, it was difficult to cause the energy and density of the ions to be reflected in process parameters in an easily applicable manner, and thus control these parameters, merely by means of the detection of the energy or density of the ions.

The present invention has as an object thereof to provide a plasma processing apparatus which is capable of precisely controlling the energy and density of ions injected into a substrate body, and which is capable of easily conducting the control of process parameters.

DISCLOSURE OF THE INVENTION

The present invention resides in a plasma processing apparatus possessing at least 1 electrode to which RF power is applied, and a holder for supporting a base material comprising the object of the plasma processing, wherein at least the following are provided:

a mechanism for the measurement of RF power and an RF power waveform applied to said electrode;

a calculating mechanism for calculating the energy and density of ions injected into the base material, based on measured values of the measured RF power waveform;

a memory mechanism for storing process parameters determined in conjunction with the state of the plasma as a function of the energy and the density of the ions;

a display mechanism for displaying memory contents by means of output from the memory mechanism;

a setting mechanism for setting predetermined values of the energy and density of the ions;

an input mechanism for inputting energy values and density values of the ions into the setting mechanism; and a control mechanism for controlling the energy and density of the ions within the apparatus at set values, in accordance with values set in the setting mechanism.

FUNCTION

In the present invention, a measuring mechanism for measuring an RF power and RF power waveform inputted into the electrode is present, and by means of this measuring mechanism, the RF power waveform and RF power in the processing are measured.

Based on these measured RF power waveform and RF power, the energy and density of the ions injected into the substrate body are calculated by means of the calculating mechanism.

The calculations are, for example, conducted by means of the following formulas.

$$V_p = (V_{pp}/2 + V_{dc})/2 \tag{1}$$

$$E_{ion} = V_p - V_{dc} \tag{2}$$

$$D_{ion} = P_{RF}/V_{pp} \tag{3}$$

Here, $V_p$, $E_{ion}$, $D_{ion}$, $V_{pp}$, $V_{dc}$, and $P_{RF}$, represent, respectively, the plasma potential, the ion energy, the ion density, the peak-to-peak potential of the RF waveform, the DC self-bias, and the RF power.

In the present invention, the process parameters, which are functions of the energy and density of the ions, are determined in advance as functions of the energy and density of the ions, and are stored in advance in the memory mechanism (for example, the CPU of a computer). Here, examples of the process parameters which are functions of the energy and density of the ions include, for example, external parameters such as RF power, RF frequency, gas pressure, gas flow rate, gas type, and type of added gas, and the like, as well as the degree of damage, the degree of heavy metal contamination, etching rate, selectivity ratio, growth rate, and the like.

These process parameters may be determined in advance and stored in the memory mechanism. Furthermore, the measurement of process parameters during processes such as film growth or the like may be conducted, and the data in the memory mechanism may be singly updated.

The contents stored in the memory mechanism may be displayed by means of a display mechanism (for example, a CRT).

Referring to the displayed contents, an operator enters the energy and density of the ions by means of an input mechanism (for example, a keyboard). Of these inputted values, the energy and density of the ions are outputted to the setting mechanism. Based on a signal from the setting mechanism, the control mechanism, which controls the energy and density of the ions (for example, a mechanism which controls the RF frequency, the distance between electrodes, gas flow rate, gas pressure, type of gas, and type of added gasses), is operated, and the energy and density of the ions are controlled at predetermined values, and process parameters such as the degree of damage, the degree of heavy metal contamination, the etching rate, the selectivity ratio, and the growth rate, are controlled.

(Description of the References)

Figure 1:
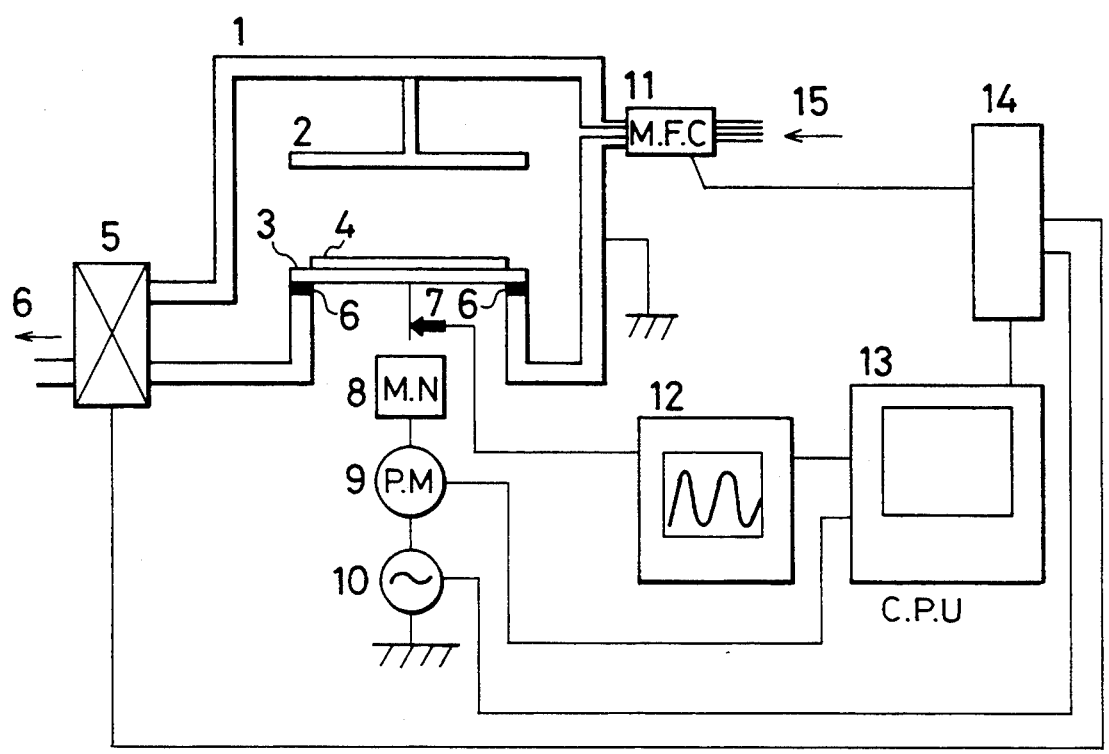
FIG. 1 is a concept diagram showing a structural example of the present invention.

1 plasma chamber
2 upper electrode
3 lower electrode
4 substrate body (substrate)
5 throttle valve
6 insulation ring
7 RF probe
8 matching network
9 power meter
10 RF power source
11 mass flow controller
12 RF oscillator (oscilloscope)
13 computer measurement system
14 control system
15 gas input port 16 exhaust system

BEST MODE FOR CARRYING OUT THE INVENTION

A structural example of the present invention is shown in FIG. 1. The plasma chamber, which possesses electrodes which are subject to glow discharge as a result of RF power input, comprises a pressure control system and an RF power input system. The excited gasses are introduced from gas system 15, and the gas pressure within the plasma processing chamber is adjusted to a predetermined value by means of the mass flow controller 11 which controls the gas flow rate, and the throttle valve 5, which adjusts the conductance of the exhaust system. During pressure adjustment, the reduction of the exhaust system conductance is necessary in order to rapidly remove the reaction products generated in the plasma processing chamber, and to employ the source gas purity as the process gas purity without alteration, so that it is preferable to conduct an adjustment of the pressure solely by means of the mass flow controller.

The excited gasses may comprise a single gas or a mixed gas, and all gasses which are excitable in a plasma state may be employed; for example, common gasses such as $N_2$, $O_2$, $H_2$, He, Ne, Ar, Xe, Kr, and the like, hydrogenated gasses such as $SiH_4$, $Si_2H_6$, $Ph_3$, $AsH_3$, $GerH_4$, $B_2H_5$, and the like, halogenated gasses such as $CCl_4$, $CF_4$, $AsCl_3$, $AsF_3$, $BCl_5$, $BF_2$, $PCl_3$, $PF_5$, $NF_3$, $SF_2$, $Br_2$, $Cl_2$, $F_3$, $WF_3$, freon-type gasses and the like, alkoxide gasses such as Al-types, Cu-types, Ga-types, and the like, $SiH_2Cl_2$, $SiHCl_3$, TEOS, HI, HBr, HCl, HF, and the like.

The RF power which is applied to electrode 3 is adjusted by RF oscillator 10, and is inputted via matching network 8. The electrode 3 to which the RF power is applied is insulated from plasma chamber 1 by means of insulating ring 6.

In the present preferred embodiment, the plasma processing chamber is a cathode-coupling type, in which the substrate 4 to be treated is placed on an electrode to which RF power is applied. Plasma chambers are divided into cathode-coupling types, anode-coupling types, or 2-frequency excitation types based on the positions of the RF power input electrode and substrate placement electrode; however, in the present invention, any of these types of apparatuses may be used as the plasma processing apparatus.

All materials which may be plasma-treated, such as metallic materials, organic materials, non-metallic materials, optical materials, electromagnetic materials, and the like, may be employed as the substrate body; in particular, conductors such as Cu, Al, Ag, Au, Pt, $SnO_2$, $In_2O_3$, $Cd_2SnO_4$, and the like, Y-system, Ta-system, and Bi-system oxide superconductors, semiconductors such as Si, Ge, GaAs, GaP, InP, InSn, and the like, insulating materials such as $Al_2O_3$, $SiO_2$, $Si_3N_4$, and the like, strongly dielectric materials such as PZT, $BaTiO_2$, $Ta_2O_5$, $TiO_2$, and the like, magnets such as ferrite-system magnets, AlNiCo-system magnets, and SmCo, and the like, and optically functional materials, may be employed.

The RF power waveform applied to the electrode is measured by means of the RF probe 7 and oscilloscope 12, which are provided directly below the electrode to which the waveform is applied, and the RF power is measured by means of power meter 9.

Figure 2:
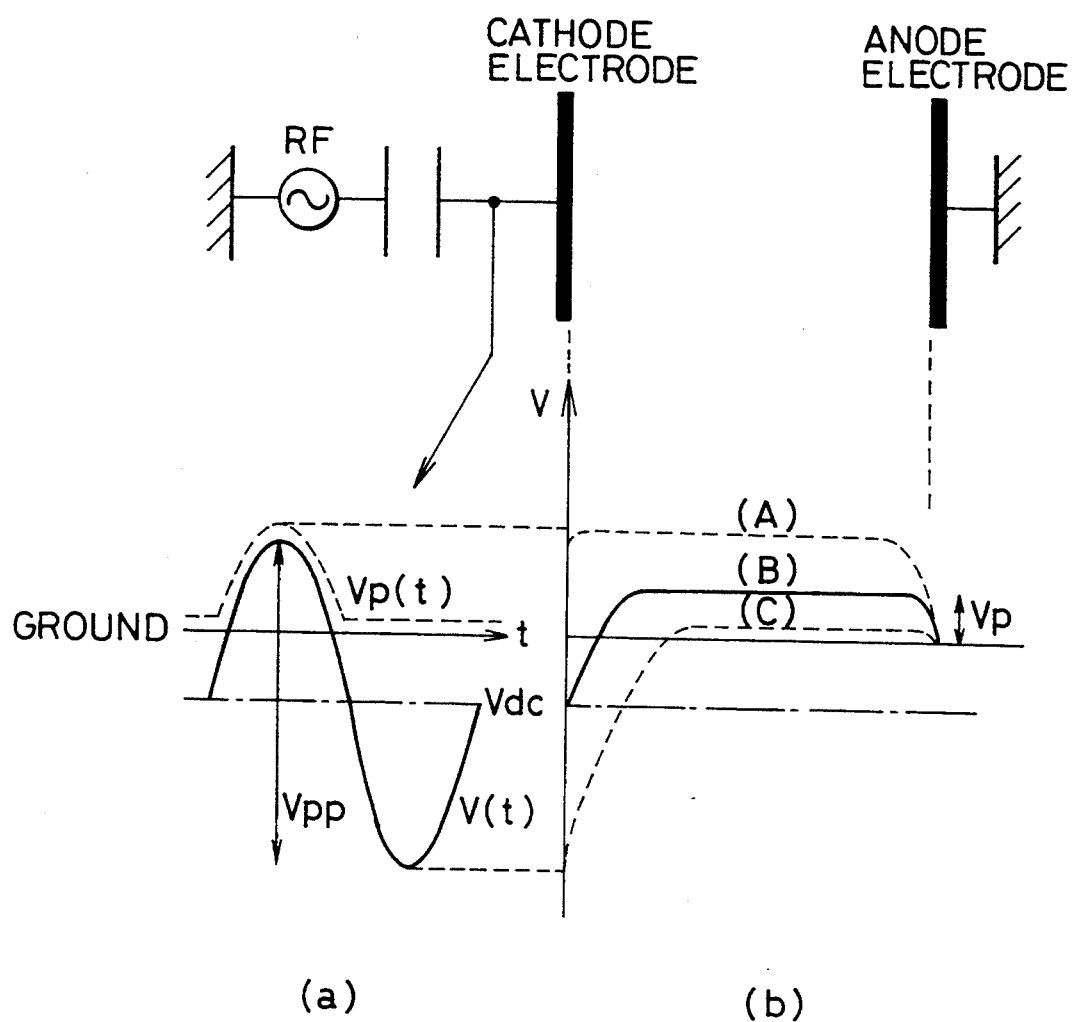
FIG. 2 is a RF power waveform diagram.

The electrons generated within the plasma can be caused to conform to the RF power frequency in the present invention, and a frequency range from a few KHz to a few GHz in which the ions cannot be caused to sufficiently conform may be employed, but a frequency range from a few MHz to hundreds of MHz is preferable, and it is desirable that the measured RF power waveform resemble a sine wave. The measured RF voltage waveform and the RF power value are inputted into computer 13, which possesses a CRT (display mechanism). The state of the plasma, for example, the energy and density of the ions, is calculated from the relationships shown in FIG. 2 by means of the formulas given below.

$$V_p = (V_{pp}/2 + V_{dc})/2 \quad (1)$$

$$E_{ion} = V_p - V_{dc} \quad (2)$$

$$D_{ion} = P_{RF}/V_{pp} \quad (3)$$

Here, $V_p$, $E_{ion}$, $D_{ion}$, $V_{pp}$, $V_{dc}$, and $P_{RF}$, represent, respectively, the plasma potential, the ion energy, the ion density, the peak-to-peak potential of the RF waveform, the DC self-bias, and the RF power.

Figure 3:
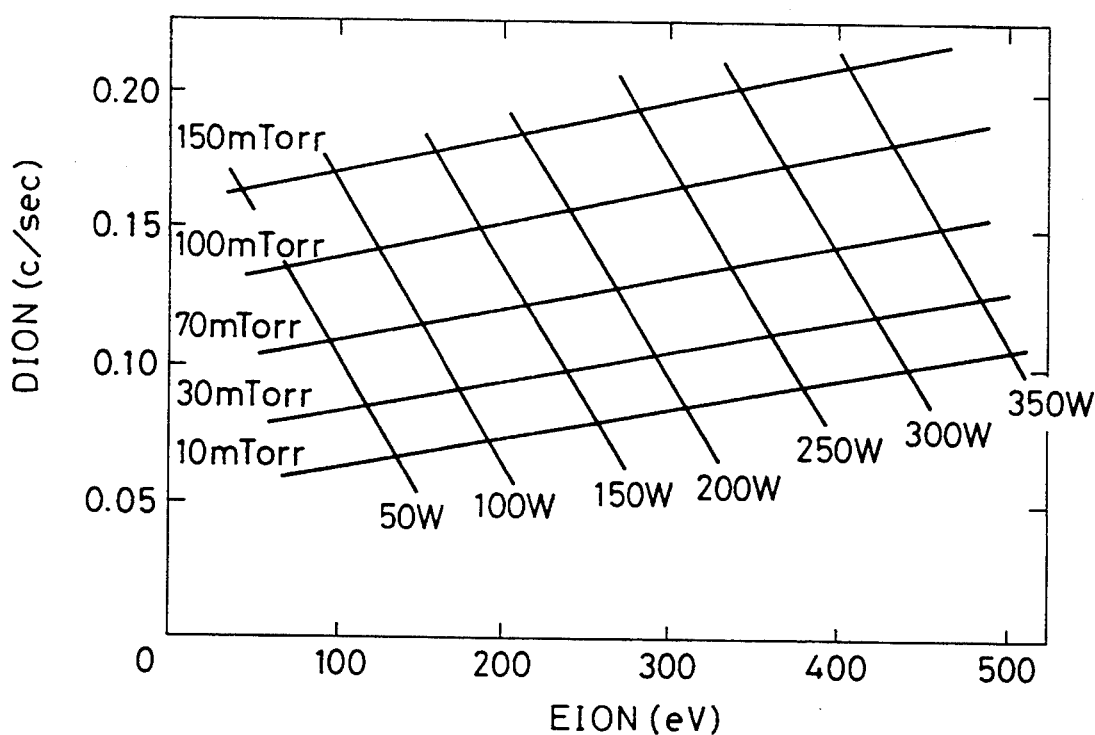
FIG. 3 is a graph showing the relationship between the ion energy and density which is displayed on the CRT screen.

The ion energy and density within the pressure range and RF power range of the plasma processing apparatus are measured in advance, and the results of these measurements are arranged as shown in FIG. 3, and stored in the memory mechanism, and are displayed on the display element (CRT) by means of output from the memory mechanism. During the actual processing, the predetermined ion energy and density are inputted by means of a an input pen or a keyboard (input mechanism), and are outputted to the setting mechanism. It is preferable that the inputted values be displayed on the CRT. During plasma processing, the ion energy and density are monitored, and a control system 14 is provided which executes control so that this ion energy and density does not deviate from the predetermined ion energy and density.

In the present preferred embodiment, the ion energy and the ion density are controlled by means of controlling the RF power of the RF oscillator 12, the flow rate of the mass flow controller 11, and the conductance of the throttle valve 5 of the exhaust system. In addition, control which is executed by means of controlling the RF frequency, the distance between electrodes, the electrode structure, the type of gas, and the amount of added gasses, and the like, is also possible.

It is also possible to add a mass spectrometer or a spectral analysis such as absorption spectra or the like to the plasma processing apparatus. In the present invention, the relationships between the evaluation results of the ion energy and ion density with respect to the plasma state, such as the energy distribution and the type and density of the ions or radicals, which may be evaluated by such analyses, are displayed on the CRT, and by means of inputting the energy distribution and the type and density of the ion radicals on the CRT, control may be executed. Furthermore, the evaluation results of the ion energy and ion density of the present invention may be displayed on the CRT as functions with respect to process parameters which are determined in conjunction with the plasma, such as the degree of damage, the degree of heavy metal contamination, etching rate, and selectivity ratio, and sputtering rate or deposition rate, in addition to the state of the plasma; by means of inputting these values on the CRT, control may be executed.

Figure 4:
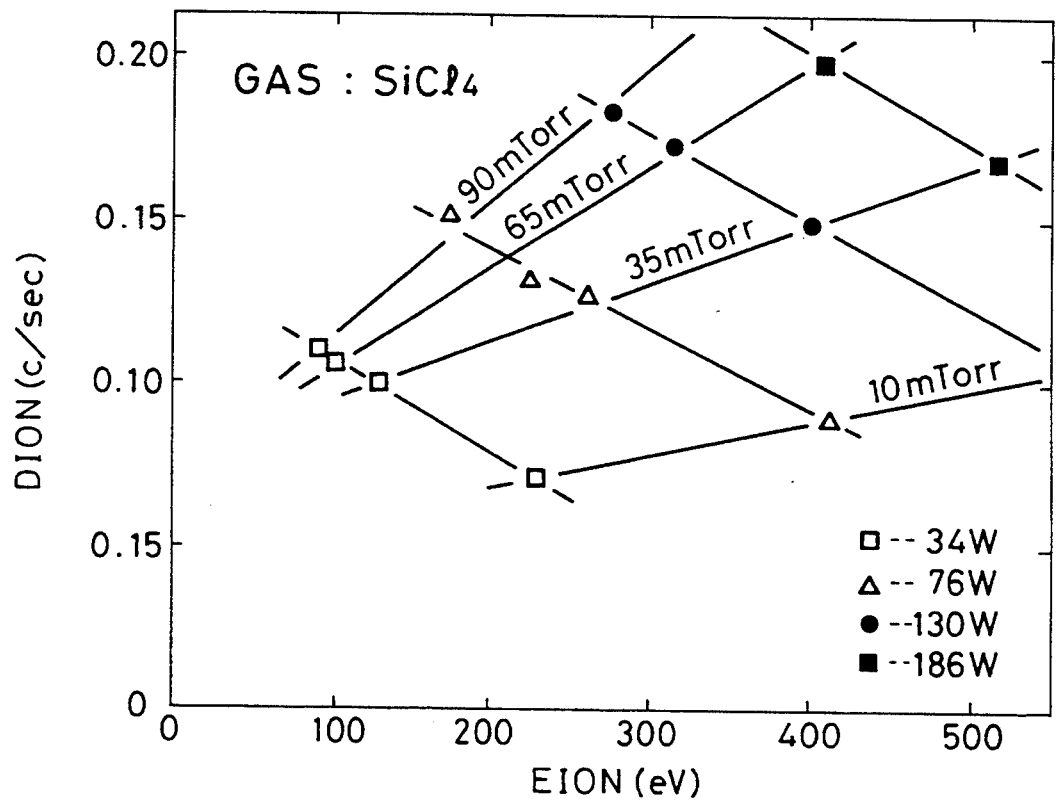
FIG. 4 is a graph showing the relationship between the ion energy and density which is displayed on the CRT screen.

1) A relationship between the ion energy and density displayed on the CRT screen when SiCl4 gas is employed in a cathode-coupling type RIE apparatus in which the gas is excited by means of a 13.56 MHz RF input is shown in FIG. 4. It is clear that $E_{ion}$ increases as the RF power rises or as the pressure falls, while Dion increases as the RF power falls, or as the pressure rises. In the case in which an oxide film was formed on the Si substrate, this oxide film was formed into a mask, and the Si was subjected to etching, when ion energy and ion density values of, respectively, 300 eV and 0.11 c/sec were inputted onto the CRT screen, and etching was conducted for a period of 10 minutes, the etching depth of the Si was 5630 Å, and the etching film thickness of the oxide film was 520 Å.

Figure 5:
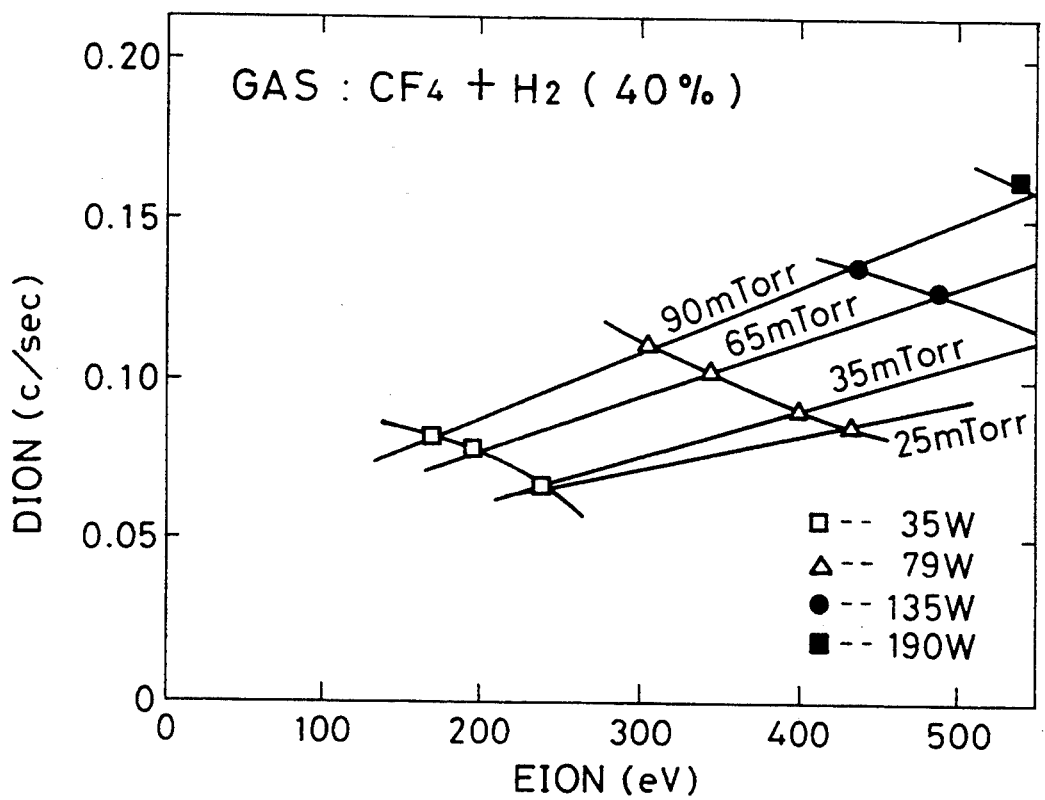
FIG. 5 is a graph showing the relationships between the energy and density of the ions, and between the RF power and gas pressure, which is displayed on the CRT screen.

2) The relationship of the externally controllable RF power and gas pressure, is shown in FIG. 5 on a graph of the function of the ion energy and density shown on the CRT screen when a mixed gas in which 40% flow rate ratio of $H_2$ was added to $CF_4$ in the same apparatus. $E_{ion}$ and $D_{ion}$ exhibit the same tendencies as SiCl4. In the case in which a 7000 Å oxide film is formed on a Si substrate and etching is conducted using this oxide film as a resist mask, when ion energy and ion density values of, respectively, 350 eV and 0.10 c/sec were inputted into the CRT, and etching was conducted, the oxide film on the Si was etched in a period of 17 minutes.

Figure 6:
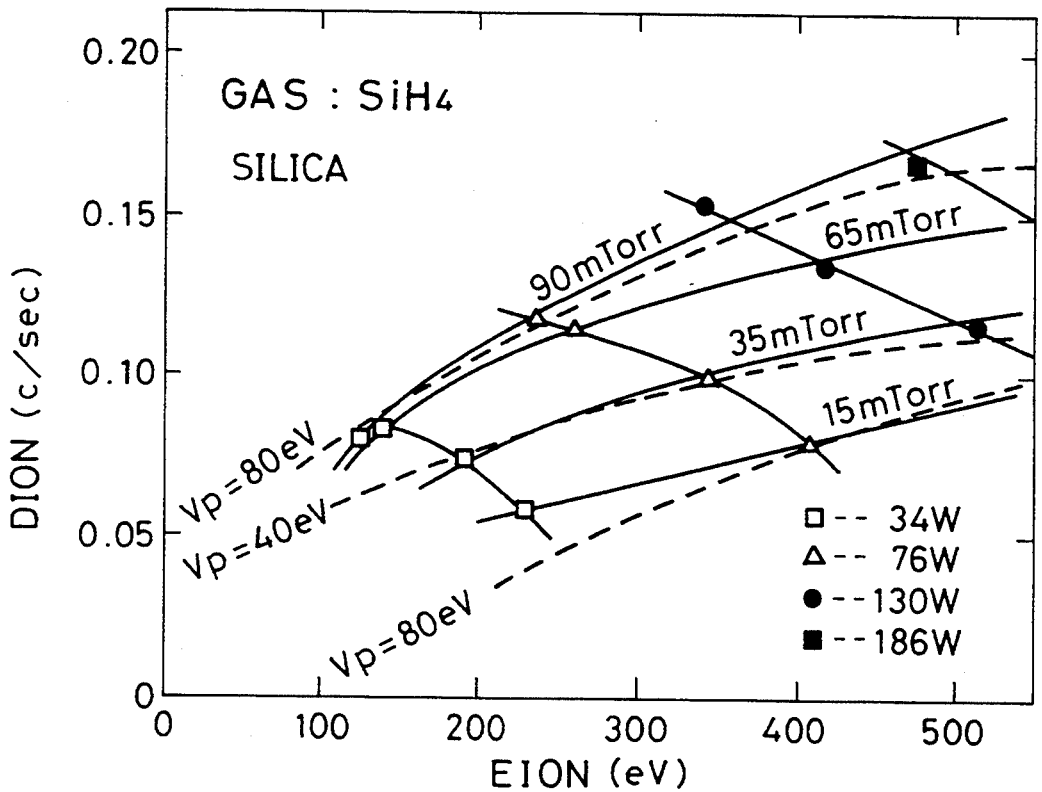
FIG. 6 is a graph showing the relationships between the energy and density of the ions, and between the RF power and gas pressure, which is displayed on the CRT screen.

3) The relationship between the externally controllable RF power and gas pressure is shown in FIG. 6 on a graph of a function of ion energy and density displayed on the CRT screen, when SiH4 gas was employed in a cathode-coupling type plasma CVD apparatus in which the gas was excited by means of a 13.56 MHz RF input. $E_{ion}$ and $D_{ion}$ exhibit the same tendencies as SiCl4.

Figure 7:
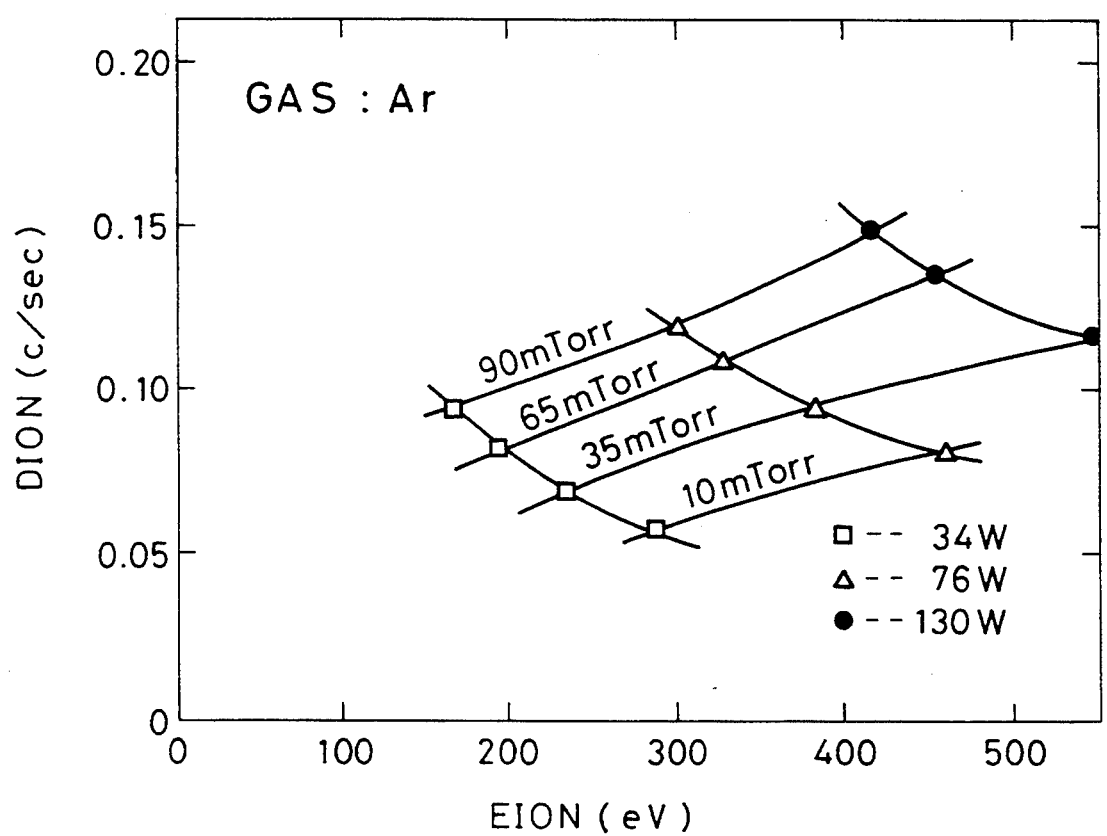
FIG. 7 is a graph showing the relationships between the energy and density of the ions, and between the RF power and gas pressure, which is displayed on the CRT screen.

4) The relationship between the externally controllable RF power and gas pressure is shown in FIG. 7 on a graph of a function of ion energy and density which is displayed on a CRT screen, when Ar gas was employed in a cathode-coupling type sputtering apparatus in which the gas is excited by means of a 13.56 MHz RF input. $E_{ion}$ and $D_{ion}$ exhibit the same tendencies as SiCl4.

Figure 8:
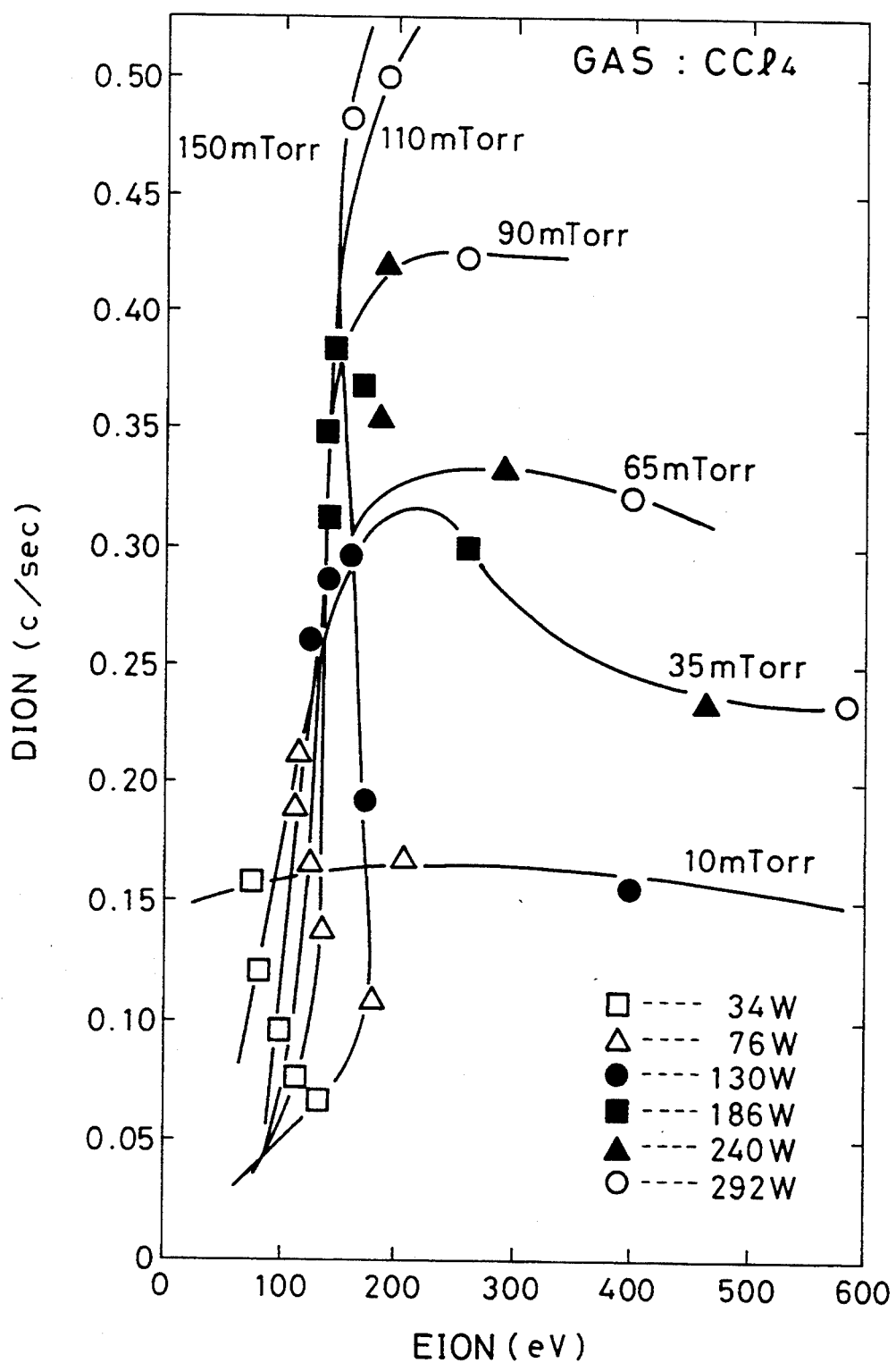
FIG. 8 is a graph showing the relationships between the energy and density of the ions, and between the RF power and gas pressure, which is displayed on the CRT screen.

5) The relationship of the externally controllable RF power and gas pressure is shown in FIG. 8 on a graph of a function of ion energy and density which is displayed on a CRT screen, when CCl4 gas was employed in a cathode-coupling type RIE apparatus in which the gas is excited by means of a 13.56 MHz RF input. In the region of high pressure, $E_{ion}$ is stable, while only $D_{ion}$ increases greatly. However, in the region of low pressure, $D_{ion}$ is stable, while the $E_{ion}$ peak increases greatly. Furthermore, when the RF power is stable and the gas pressure is raised, at high power levels of 130 W or more, $D_{ion}$ increases, while $E_{ion}$ becomes smaller; however, if the gas pressure is further increased, $E_{ion}$ increases only slightly from the inflection point, and $D_{ion}$ becomes smaller, and at an electromotive force of less than 76 w, $E_{ion}$ slightly increases, while $D_{ion}$ becomes smaller.

Figure 9:
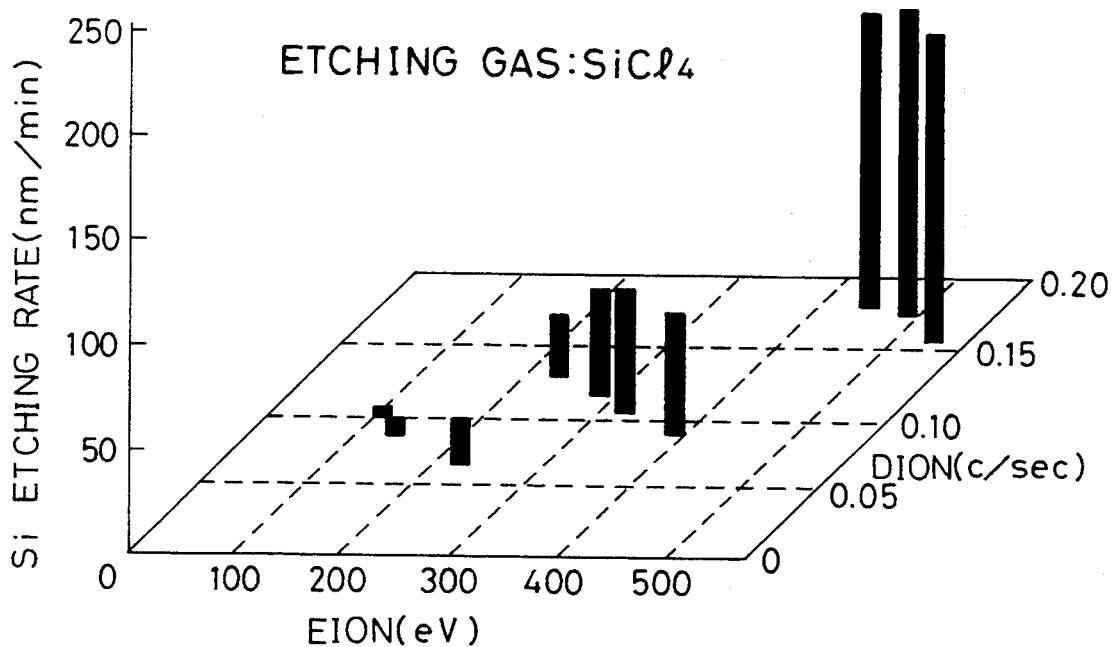
FIG. 9 is a graph showing the relationship between the energy and density of the ions, and the etching rate, in the case in which Si is subjected to etching using an oxide film mask when $SiCl_4$ is employed, which is displayed on the CRT screen.
Figure 10:
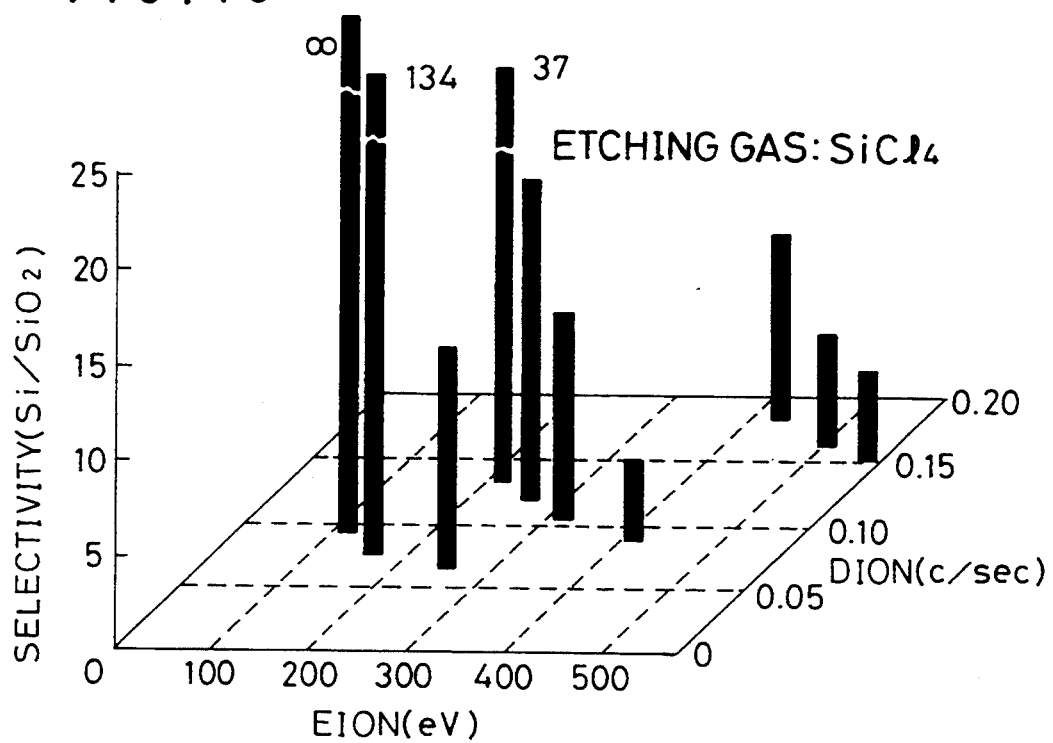
FIG. 10 is a graph showing the relationship between the energy and density of the ions and the selectivity ratio with the oxide film, in the case in which Si is subjected to etching using an oxide film mask when $SiCl_4$ gas is employed, which is displayed on the CRT screen.

6) The relationship between the etching rate and the selectivity ratio with the oxide film is shown in FIGS. 8 and 9, respectively, on a graph showing the function of the ion energy and density displayed on the CRT screen, in the case in which the etching of Si using an oxide film mask was conducted, when SiCl4 gas was employed, in a cathode coupling type RIE apparatus in which the gas is excited by means of a 13.56 MHz RF input. As $E_{ion}$ and $D_{ion}$ increase, the etching rate becomes faster, and the selectivity ratio increases as $E_{ion}$ is reduced and $D_{ion}$ increases.

Figure 11:
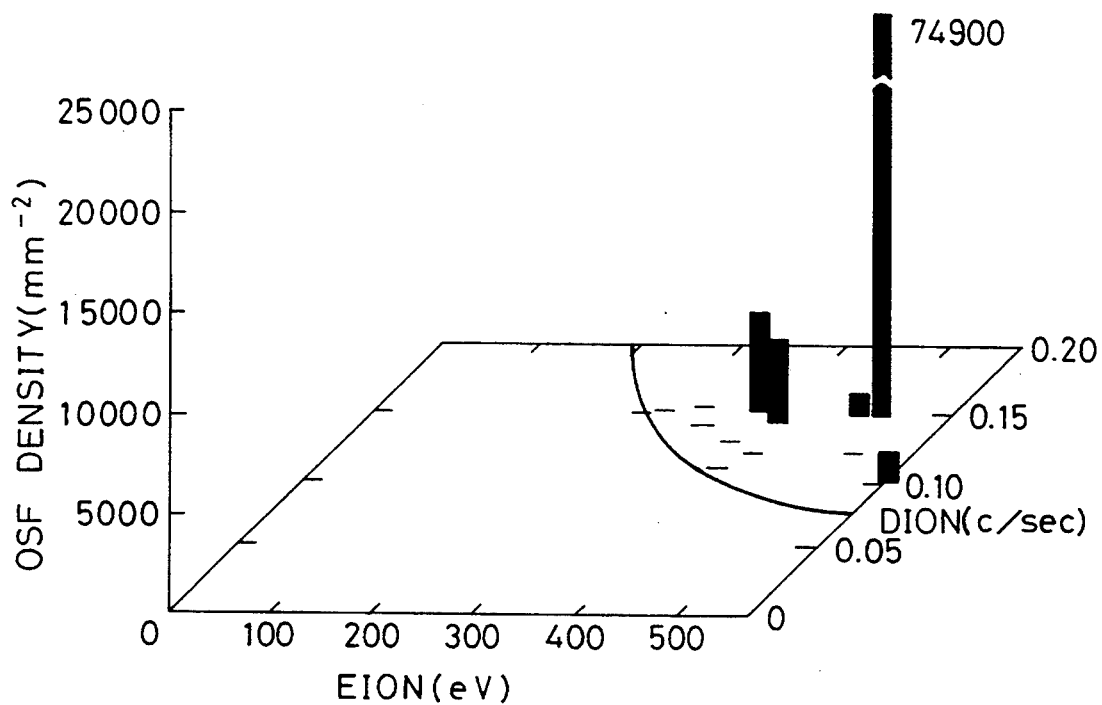
FIG. 11 is a graph showing the relationship between the energy and density of the ions and the oxidation induced stacking fault (OSF) density, which is employed as an index in the evaluation of damage which enters a Si substrate after 5 minutes of etching when $SiCl_4$ gas is employed, which is displayed on the CRT screen.

7) The results of an evaluation of the degree of oxidation induced stacking faults (OSF), which serves as an index for the evaluation of damage entering the Si substrate when etched for a period of 5 minutes by SiCl4 gas, are shown in FIG. 11 on a graph of the function of ion energy and density displayed on the CRT screen, in a cathode-coupling type RIE apparatus in which the gas is excited by means of a 13.56 MHz RF input. The solid line in the figure indicates the boundary line at which OSF was observed; as $E_{ion}$ and $D_{ion}$ increase beyond the boundary line, OSF is seen to a greater extent, and it can be seen that damage is caused to the Si substrate.

Figure 12A:
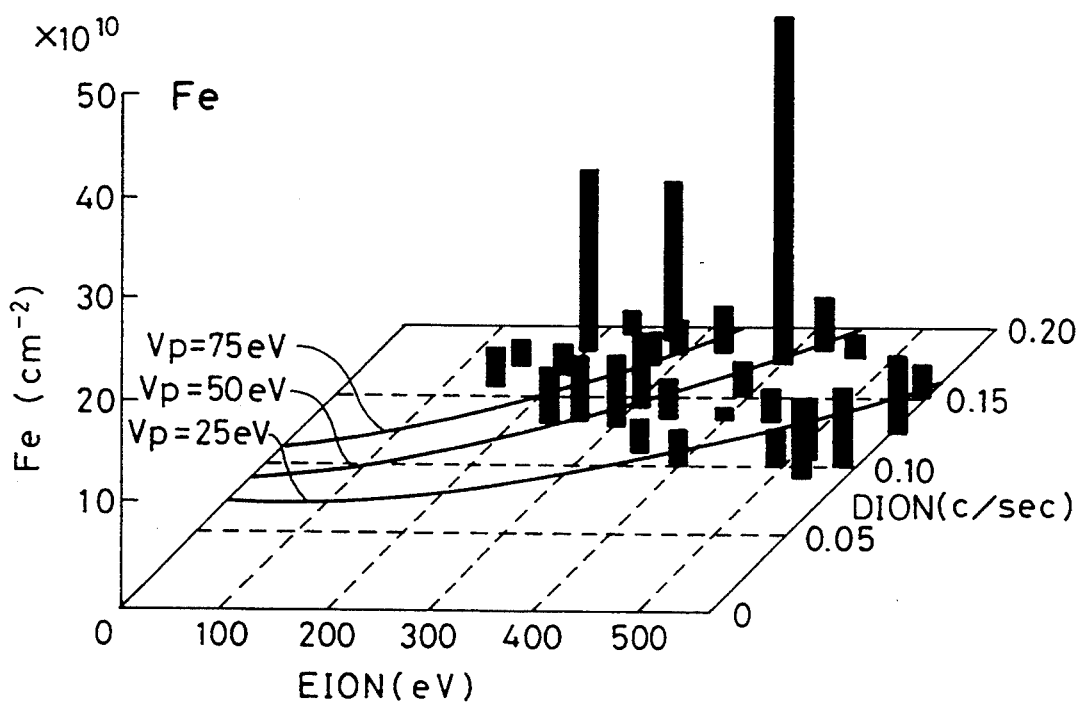
FIG. 12a is a graph showing the relationship between the energy and density of the ions and the results of the evaluation of the heavy metal contamination entering a Si substrate after etching for a period of 5 minutes, when $SiCl_4$ gas is employed, as evaluated by a total reflection x-ray fluorescence analyzer (TRXF), which is displayed on the CRT screen.
Figure 12B:
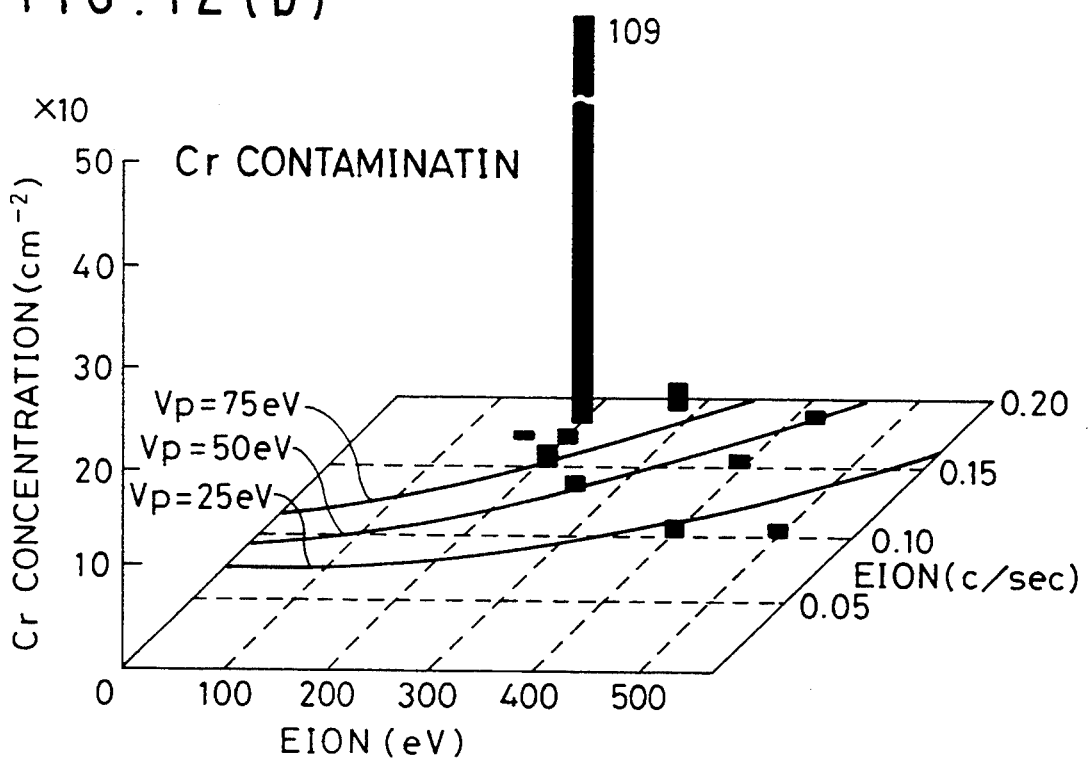
FIG. 12b is a graph showing the relationship between the energy and density of the ions and the results of an evaluation of the heavy metal contamination entering a Si substrate after etching for a period of 5 minutes in an atmosphere of $SiCl_4$ gas, as evaluated by a total reflection x-ray fluorescence analyzer (TRXF), which is displayed on the CRT screen.
Figure 12C:
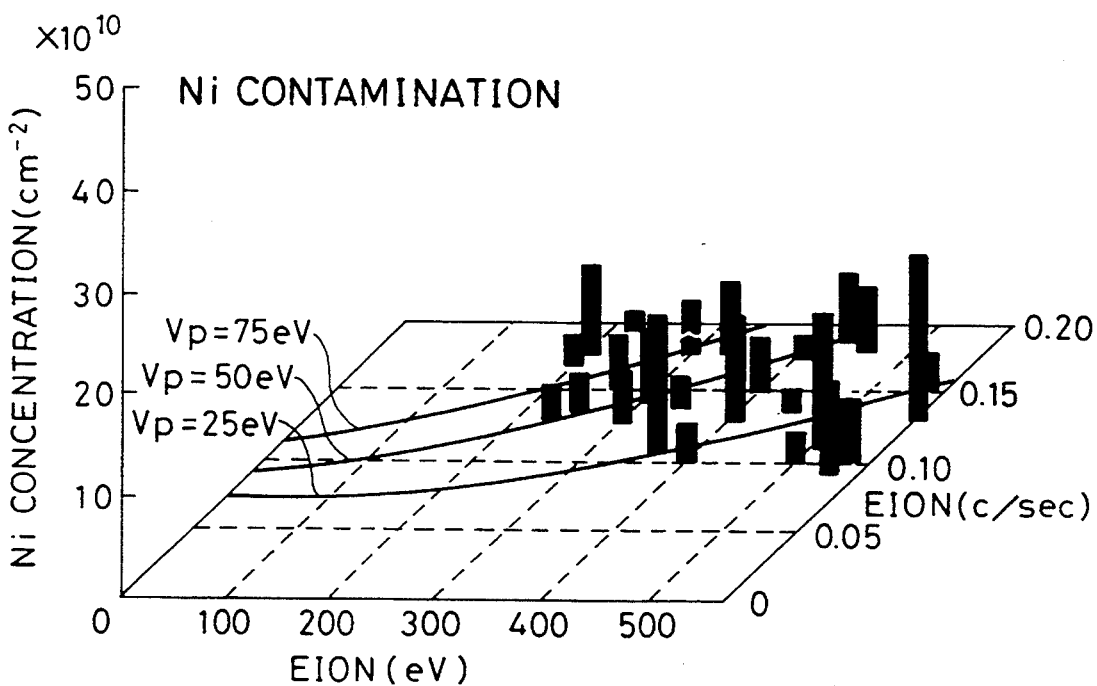
FIG. 12c is a graph showing the relationship between the energy and density of the ions and the results of an evaluation of the heavy metal contamination entering a Si substrate after etching for a period of 5 minutes in an atmosphere of $SiCl_4$ gas, as evaluated by a total reflection x-ray fluorescence analyzer (TRXF), which relationship is displayed on a CRT screen.

8) The results of an evaluation of the heavy metal contamination entering a Si substrate when etched for a period of 5 minutes by means of SiCl4 gas, as evaluated by a total reflection x-ray fluorescence analyzer (TRXF), are shown in FIG. 12 on a graph of a function of ion energy and density which is displayed on the CRT screen, in a cathode-coupling type RIE apparatus in which the gas is excited by means of a 13.56 MHz RF input. The solid lines on the figure indicate plasma potential lines ($V_p$). Fe and Ni increase as V increases, and it can be seen that Ni is widely distributed over various values of $Eio_n$ and $Dio_n$.

Figure 13:
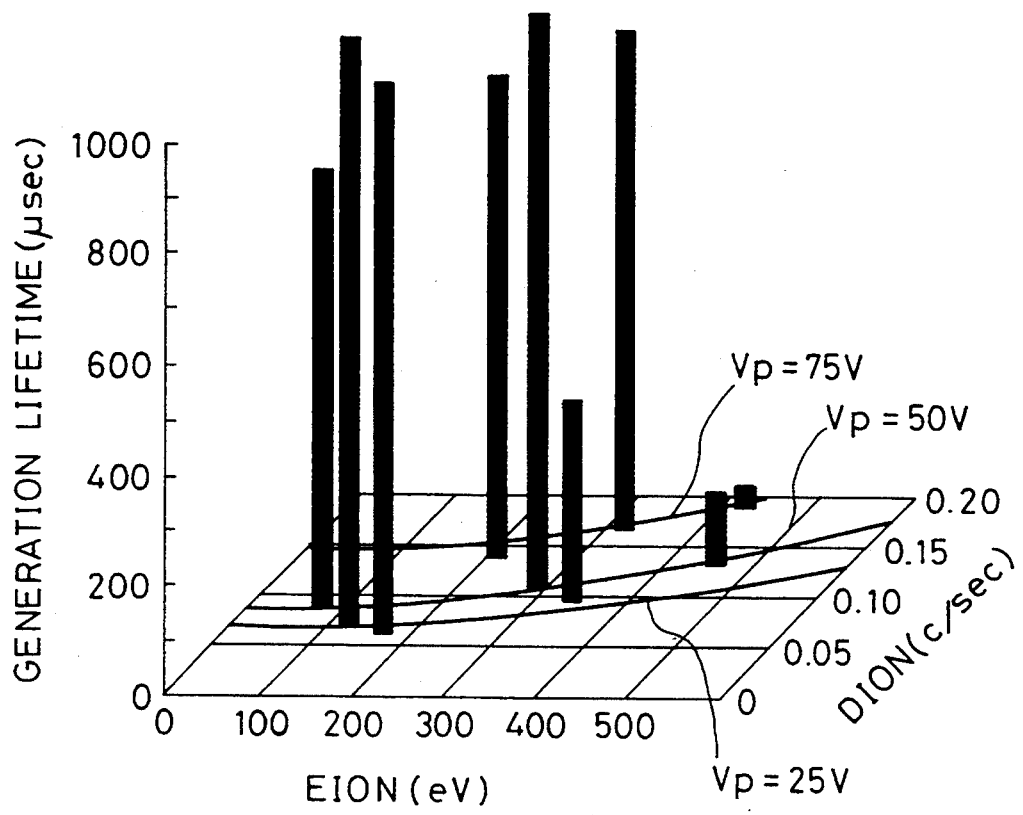
FIG. 13 is a graph showing the relationship between the energy and density of the ions and the generated lifetime of the minority carrier, which is displayed on the CRT screen.
Figure 14:
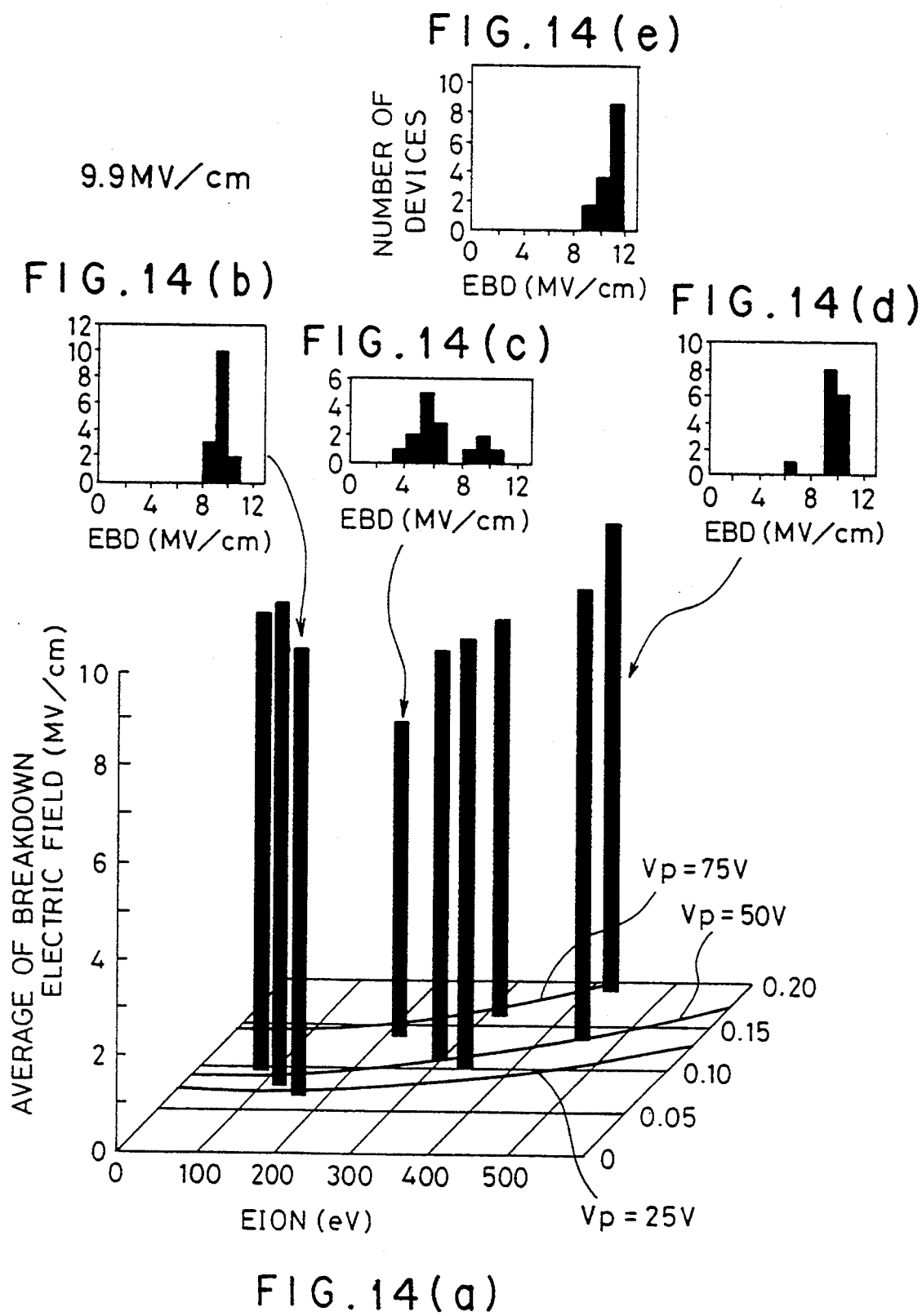
FIG. 14 is a graph showing the relationship between the energy and density of the ions and the oxide film pressure resistance, which is displayed on the CRT screen.

9) The generated lifetime of the minority carrier and the results of the oxide film pressure resistance are shown in FIGS. 13 and 14 on graphs of functions of ion energy and density displayed on the CRT screen, when a MOS diode was produced in the preferred embodiment of 8). The gate oxide film thickness of the MOS diode was 300 Å, and a 1 μm Al electrode was formed. It can be seen that the generated lifetime of the minority carrier was drastically shortened when $E_{ion}$ exceeded 400 eV, and that the oxide film pressure resistance worsened as $V_p$ increased.

Figure 15:
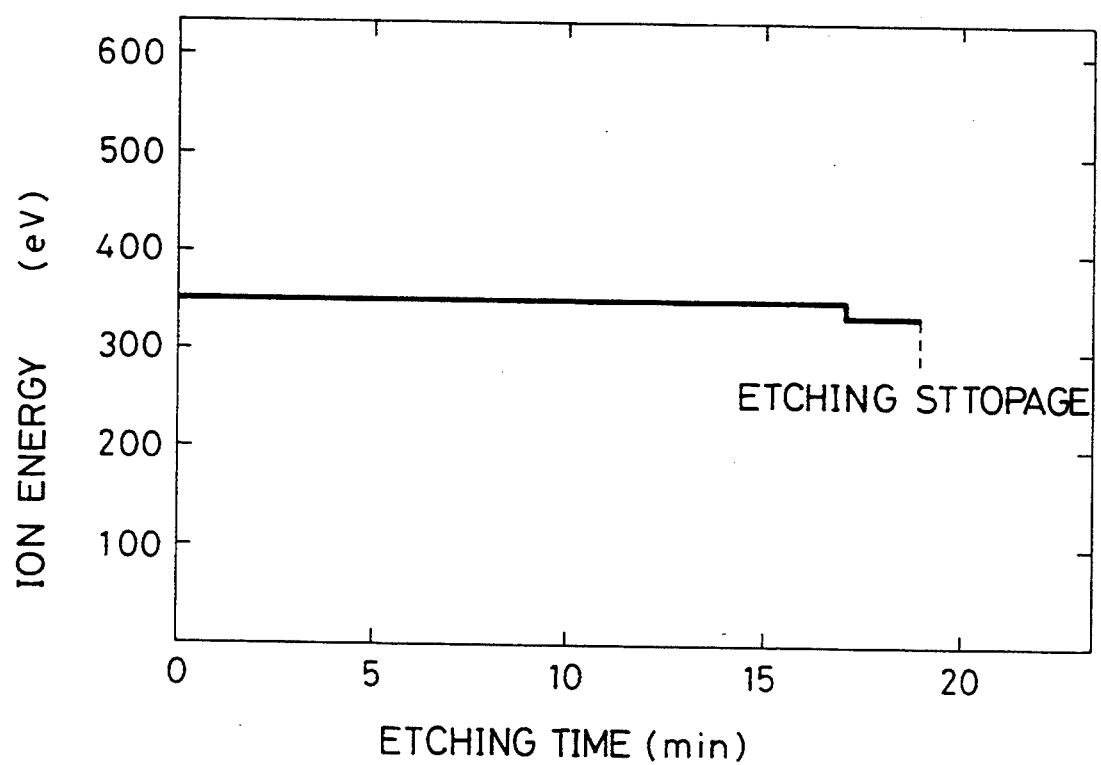
FIG. 15 is a graph showing the relationship between the energy of the ions and the etching time, which is shown on the CRT screen.

10) In the preferred embodiment of 2), it can be seen that the energy of the ions during etching changes over time, as shown in FIG. 15, and that etching is completed in a period of 17 minutes. In this way, the detection of the stopping point of etching becomes possible.

Figure 16:
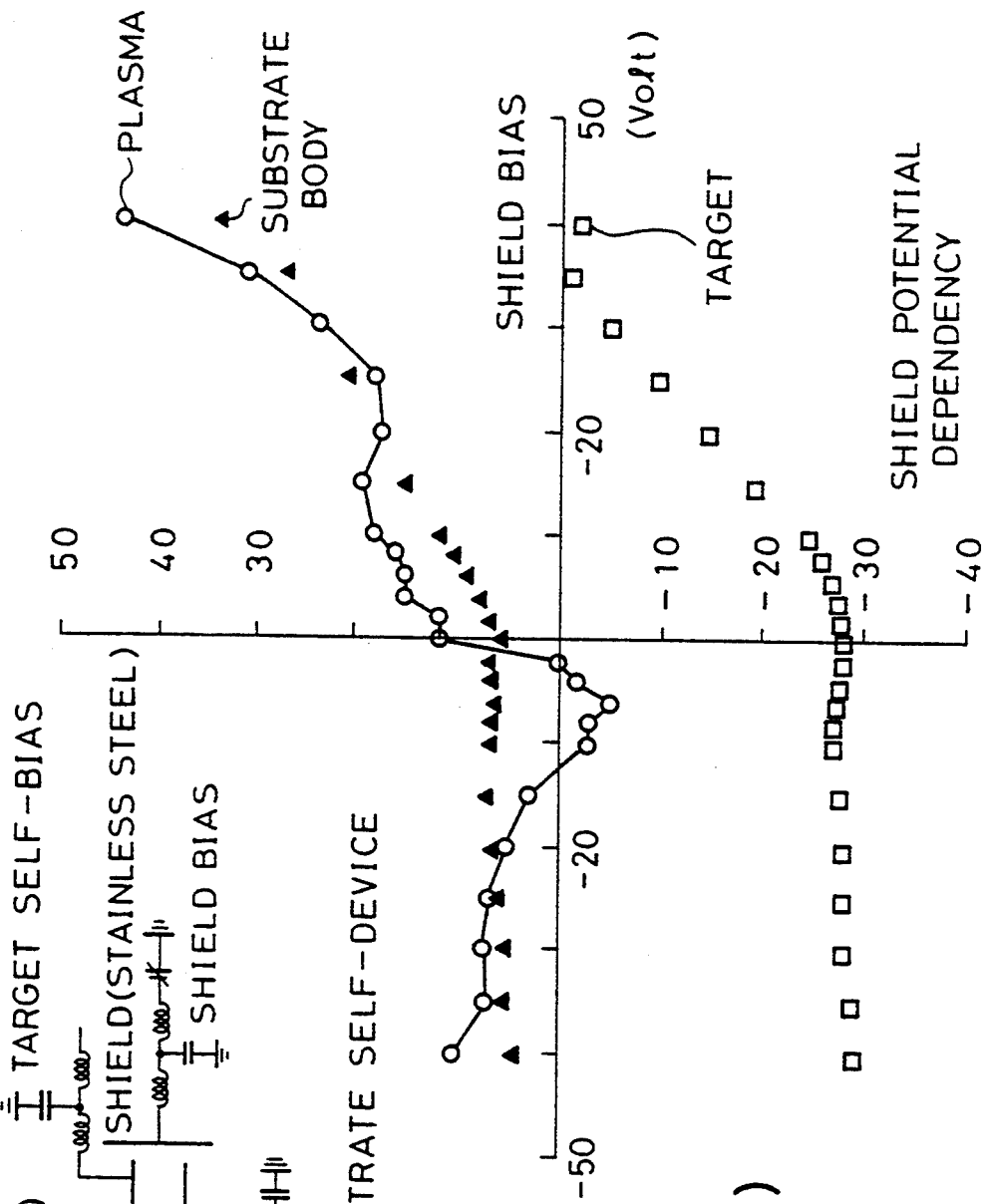
FIG. 16 is a graph showing the shield potential dependency of the plasma potential.

11) It is also possible to additionally install a shield electrode, around which the potential can be controlled, in the plasma processing apparatus, and to control the plasma potential by means of the controlling of the potential of this electrode. The results thereof are shown in FIG. 16. When a RF power of 100 MHz is applied to the upper electrode, and the potential of the shield electrode is altered, at a level of −5 V, the plasma potential becomes a negative potential.

Figure 17:
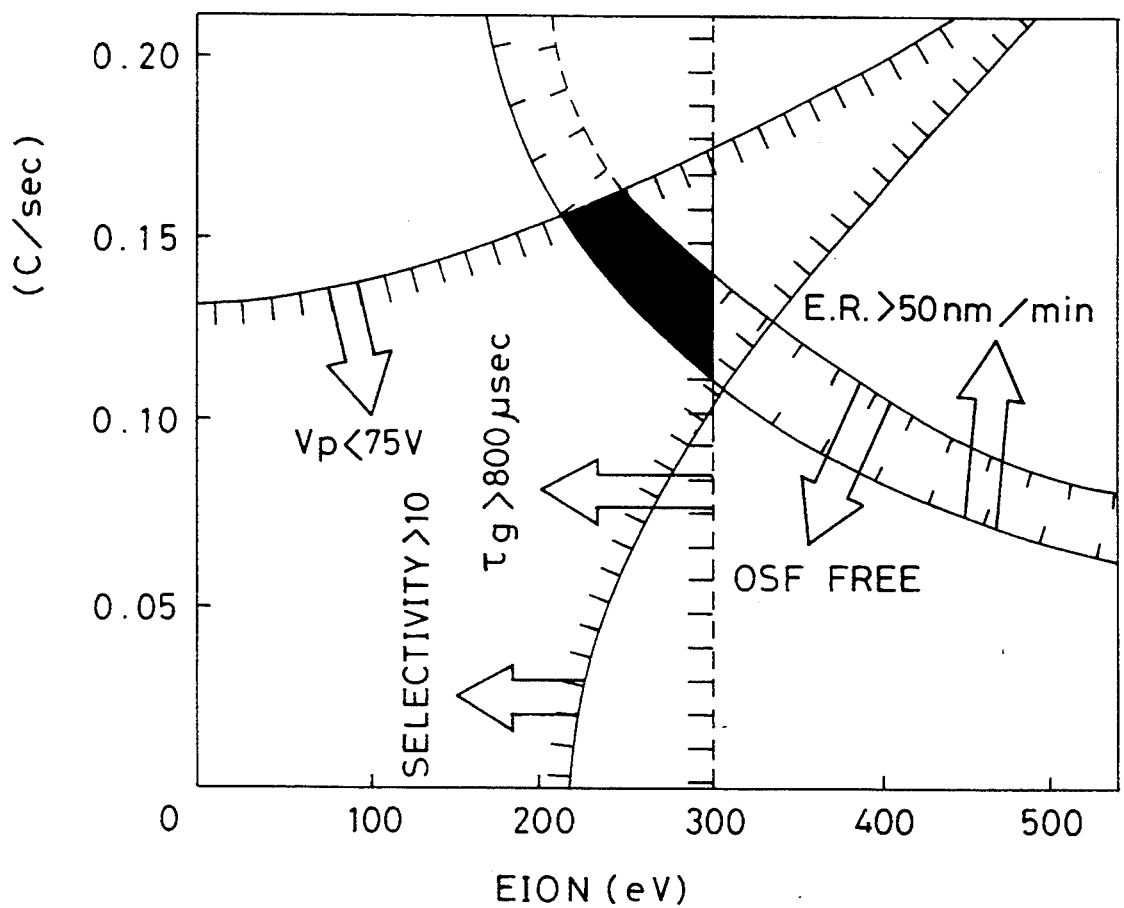
FIG. 17 is a graph showing the relationship between the energy and density of the ions and various process parameters, which is shown on the CRT screen.

12) The results when etching is conducted with SiCl4 gas, as described above, can be compiled and displayed on the CRT screen, as shown in FIG. 17. In order to realize damage-free, heavy metal contamination-free, high speed, and highly selective etching, it is necessary to conduct etching within $E_{ion}$ and $D_{ion}$ value ranges represented by the darkened region in the figure.

Industrial Applicability

The present invention can be realized by, in any plasma processing apparatus in which introduced gas is excited by means of the application of RF power, determining the important parameters of the energy and density of ions injected into a substrate by means of a simple process for measuring the RF voltage waveform and the RF power, and, based on these results, plotting process parameters, such as external parameters which are externally controllable, such as RF power, RF frequency, gas pressure, gas flow rate, type of gas, and type of added gas and the like, or the degree of damage, the degree of heavy metal contamination, the etching rate, the selectivity ratio, the growth rate and the like, on a graph showing a function of the energy and density of the ions; precisely controlling the energy and density of the ions at predetermined values; and thus controlling the parameters of the process.

I claim:

1. A plasma processing apparatus possessing at least 1 electrode to which RF power is applied, and a holder for supporting a substrate body comprising an object of the plasma processing, wherein at least the following are provided:

a means for the measurement of RF power and an RF power waveform inputted into said electrode;

a calculating means for calculating energy and density of ions injected into said base material, based on measured values of said measured RF power waveform;

a memory means for storing process parameters determined in conjunction with a state of a plasma as a function of said energy and said density of said ions;

a display means for displaying memory contents by means of output from said memory means;

a setting means for setting predetermined values of energy and density of ions;

an input means for inputting energy values and density values of ions into said setting means; and a control means for controlling energy and density of ions within said apparatus at set values, in accordance with values set in said setting means.

2. A plasma processing apparatus in accordance with claim 1, in which said electrode is laid on said holder.

3. A plasma processing apparatus in accordance with claim 1, wherein, in said holder, a means for applying RF power having a frequency differing from that of said electrode is provided.

4. A plasma processing apparatus in accordance with claim 1, wherein said RF power and a flow rate of gas introduced into said plasma processing apparatus are controlled, and the energy and density of said ions are controlled at predetermined values.

5. A plasma processing apparatus in accordance with claim 1, wherein gas excited by means of said plasma processing apparatus comprises a single gas or a mixed gas.

6. A plasma processing apparatus in accordance with claim 1, wherein a means for measuring changes over time in the energy and density of ions injected into a substrate body is provided.

* * * * *